United States Patent
Kim

(10) Patent No.: US 12,073,914 B2
(45) Date of Patent: Aug. 27, 2024

(54) MEMORY DEVICE, A MEMORY SYSTEM AND AN OPERATING METHOD OF THE MEMORY DEVICE

(71) Applicant: SAMSUNG ELECTRONICS CO., LTD., Suwon-si (KR)

(72) Inventor: Kyungryun Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 118 days.

(21) Appl. No.: 17/869,061

(22) Filed: Jul. 20, 2022

(65) Prior Publication Data
US 2023/0026320 A1   Jan. 26, 2023

(30) Foreign Application Priority Data

Jul. 21, 2021  (KR) .................. 10-2021-0096004
Feb. 10, 2022  (KR) .................. 10-2022-0017775

(51) Int. Cl.
*G11C 7/10* (2006.01)
*G11C 7/22* (2006.01)

(52) U.S. Cl.
CPC ............ *G11C 7/109* (2013.01); *G11C 7/1084* (2013.01); *G11C 7/1096* (2013.01); *G11C 7/22* (2013.01)

(58) Field of Classification Search
CPC ..... G11C 7/109; G11C 7/1084; G11C 7/1096; G11C 7/22
See application file for complete search history.

(56) References Cited

U.S. PATENT DOCUMENTS 7,770,049 B1 *  8/2010  Searles ................ G06F 1/10
                                                          713/401
9,087,568 B1    7/2015  Ware
(Continued)

FOREIGN PATENT DOCUMENTS

CN       112017702       12/2020
TW       201814700        4/2018
(Continued)

OTHER PUBLICATIONS

Ofice Action issued in corresponding TW Patent Application No. 111127018 on Feb. 14, 2023.
(Continued)

*Primary Examiner* — Min Huang
(74) *Attorney, Agent, or Firm* — F. CHAU & ASSOCIATES, LLC

(57) ABSTRACT

A memory device includes: a memory bank including a plurality of memory cells; and a memory interface circuit configured to store data in the plurality of memory cells based on a command/address signal and a data signal, wherein the memory interface circuit includes: first, second, third and fourth pads configured to receive first, second, third and fourth clock signals, respectively; a first buffer circuit configured to sample the command/address signal in response to an activation time of the first and third clock signals which have opposite phases from each other; and a second buffer circuit configured to sample the data signal in response to the activation time of the first clock signal, an activation time of the second clock signal, the activation time of the third clock signal and an activation time of the fourth clock signal.

21 Claims, 10 Drawing Sheets

(56) References Cited

U.S. PATENT DOCUMENTS

| | | |
|---|---|---|
| 10,083,103 B1 | 9/2018 | Kwon et al. |
| 10,254,782 B2 | 4/2019 | He |
| 10,269,397 B2* | 4/2019 | Lee .................... G11C 11/4076 |
| 10,311,925 B2 | 6/2019 | Roh |
| 10,553,264 B2 | 2/2020 | Kim et al. |
| 10,714,149 B2 | 7/2020 | Jeon |
| 10,839,889 B1 | 11/2020 | Lee et al. |
| 10,867,657 B2 | 12/2020 | Shin et al. |
| 2008/0137470 A1 | 6/2008 | Schnell et al. |
| 2012/0155212 A1* | 6/2012 | Kodama .............. G11C 7/1042 |
| | | 365/233.14 |
| 2013/0208546 A1* | 8/2013 | Kim ...................... G11C 7/222 |
| | | 365/189.05 |
| 2017/0148497 A1 | 5/2017 | Na |
| 2017/0148498 A1 | 5/2017 | Nishioka et al. |
| 2021/0151085 A1 | 5/2021 | Kim et al. |

FOREIGN PATENT DOCUMENTS

| | | |
|---|---|---|
| TW | 201835931 | 10/2018 |
| TW | I732071 | 7/2021 |

OTHER PUBLICATIONS

Extended European Search Report issued in corresponding EP Patent Application No. 22184759.3 on Dec. 16, 2022.

\* cited by examiner

MEMORY DEVICE, A MEMORY SYSTEM AND AN OPERATING METHOD OF THE MEMORY DEVICE

CROSS-REFERENCE TO RELATED APPLICATIONS

This application is claims priority under 35 U.S.C. § 119 to Korean Patent Application Nos. 10-2021-0096004, filed on Jul. 21, 2021, and 10-2022-0017775, filed on Feb. 10, 2022, in the Korean Intellectual Property Office, the disclosures of which are incorporated by reference herein in their entireties.

TECHNICAL FIELD

The inventive concept relates to a memory system, and more particularly, to a memory system including a memory controller and a memory device for interfacing based on multiple clock signals.

DISCUSSION OF RELATED ART

Electronic devices, such as a smartphone, a graphics accelerator, and an artificial intelligence (AI) accelerator, may process data using a memory device, such as dynamic random access memory (DRAM). In other words, such electronic devices may process data using a volatile memory device.

The memory device may receive a clock signal from a system on chip (SoC) and sample a command/address signal according to the clock signal. In addition to the clock signal, the memory device may receive a write clock signal from the SoC which is used to input/output high-speed data. In general, the frequency of the write clock signal is higher than the frequency of the clock signal. Thus, a certain amount of time may be needed to synchronize the write clock signal and the clock signal during a write operation.

SUMMARY

The inventive concept provides a memory system including a memory device and a memory controller that perform interfacing for a data signal and a command/address signal, based on multiple phase clock signals.

An example embodiment of the inventive concept provides a memory device including: a memory bank including a plurality of memory cells; and a memory interface circuit configured to store data in the plurality of memory cells based on a command/address signal and a data signal, wherein the memory interface circuit includes: first, second, third and fourth pads configured to receive first, second, third and fourth clock signals, respectively; a first buffer circuit configured to sample the command/address signal in response to an activation time of the first and third clock signals which have opposite phases from each other; and a second buffer circuit configured to sample the data signal in response to the activation time of the first clock signal, an activation time of the second clock signal, the activation time of the third clock signal and an activation time of the fourth clock signal.

An example embodiment of the inventive concept provides a memory system including: a memory controller configured to generate first, second, third and fourth clock signals having the same frequency and output the first, second, third and fourth clock signals, a data signal, and a command/address signal; and a memory device configured to sample the command/address signal in response to the first and third clock signals having opposite phases to each other and sample the data signal in response the first, second, third and fourth clock signals.

An example embodiment of the inventive concept provides a method of operating a memory device, the method including: receiving first, second, third and fourth clock signals having the same frequency, a data signal, and a command/address signal; sampling the data signal based on the first, second, third and fourth clock signals; sampling the command/address signal based on the first and third clock signals having opposite phases to each other; and writing the sampled data signal to a memory cell identified by the sampled command/address signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, various embodiments of the inventive concept will be described with reference to the accompanying drawings.

Figure 1:
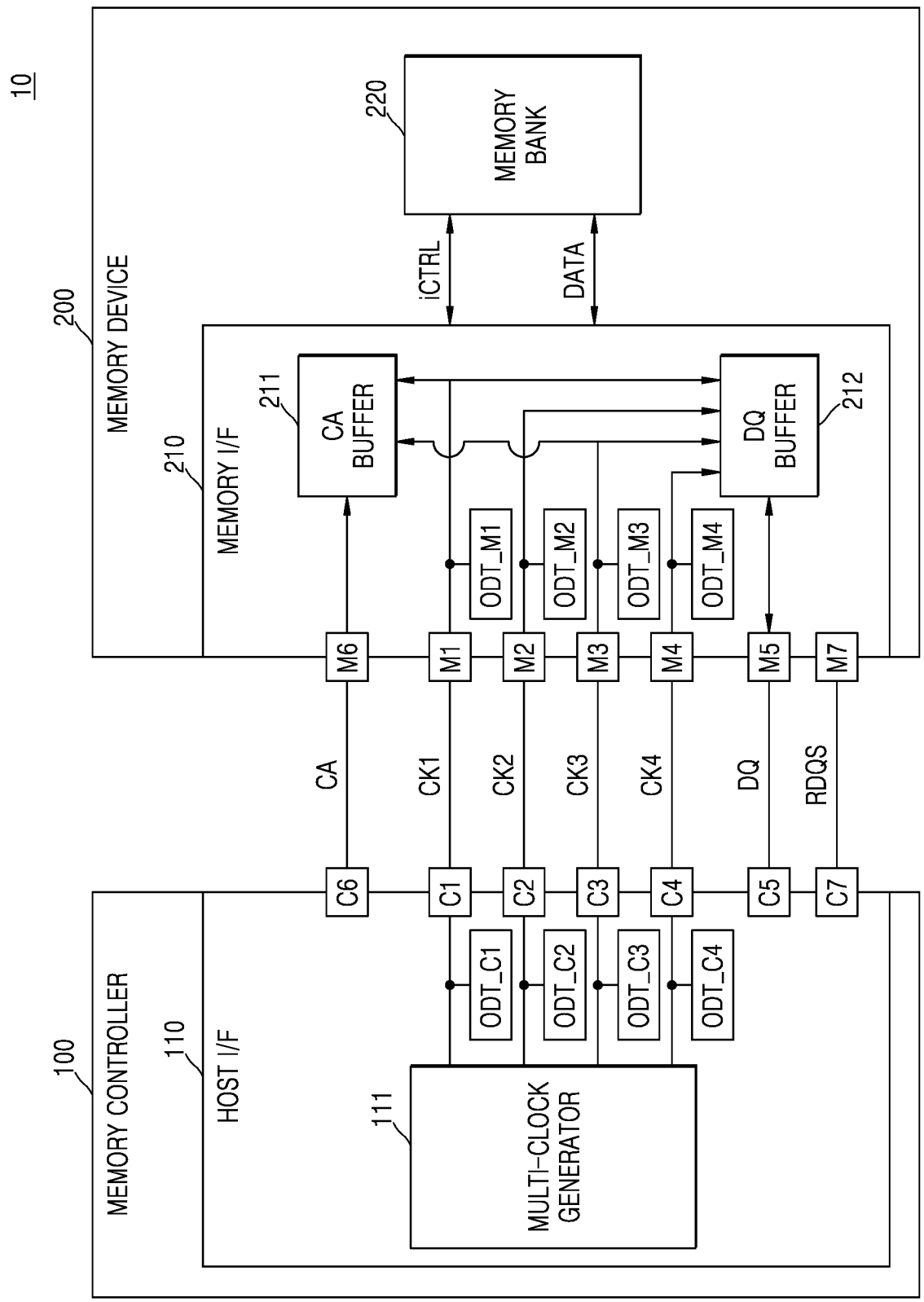
FIG. 1 is a diagram for describing a memory system according to an example embodiment of the inventive concept.

FIG. 1 is a diagram for describing a memory system 10 according to an example embodiment of the inventive concept.

Referring to FIG. 1, the memory system 10 may include a memory controller 100 and a memory device 200. The memory controller 100 may control the overall operation of the memory device 200. For example, the memory controller 100 may control the memory device 200 such that data is output from the memory device 200 or data is stored in the memory device 200. In other words, the memory controller 100 may control read and write operations of the memory device 200. For example, the memory controller 100 may be implemented as a part of a system-on-chip (SoC), but is not limited thereto.

The memory controller 100 may include a host interface circuit 110. The host interface circuit 110 may transmit, to the memory device 200, first, second, third and fourth clock signals CK1, CK2, CK3 and CK4, a data input/output signal (hereinafter, referred to as a DQ and a command/address signal (hereinafter, referred to as a CA signal). Although the CA signal is shown to be transmitted to the memory device 200 from the memory controller 100 through one signal line, the inventive concept is not limited thereto, and a command signal and an address signal may be transmitted to the memory device 200 through separate signal lines.

The host interface circuit 110 may include a multi-clock generator 111. The multi-clock generator 111 may generate the first to fourth clock signals CK1 to CK4 having different phases, respectively. For example, the first clock signal CK1 and the second clock signal CK2 may have different phases. However, the inventive concept is not limited thereto, and the multi-clock generator 111 may generate a plurality of clock signals having different phases, respectively. In other words, the multi-clock generator 111 may generate more than four clock signals. In some embodiments of the inventive concept, the phase difference between any two of the first to fourth clock signals CK1 to CK4 may be 90°. For example, the phase of the first clock signal CK1 may be 0°, the phase of the second clock signal CK2 may be 90°, the phase of the third clock signal CK3 may be 180°, and the phase of the fourth clock signal CK4 may be 270°. The multi-clock generator 111 may include a phase-locked loop (PLL) circuit or a delay-locked loop (DLL) circuit. Each of the first to fourth clock signals CK1 to CK4 may be a signal which periodically toggles between a high level and a low level. The first to fourth clock signals CK1 to CK4 may be referred to as 4-phased clock signals or multi-phased clock signals.

The memory device 200 may operate under the control by the memory controller 100. For example, the memory device 200 may output stored data or store data provided from the memory controller 100, under the control by the memory controller 100.

The memory device 200 may include a memory interface circuit 210 and a memory bank 220. The memory interface circuit 210 may receive the first to fourth clock signals CK1 to CK4 from the memory controller 100. The memory interface circuit 210 may receive the CA signal and the DQ signal from the memory controller 100.

The memory interface circuit 210 may sample the CA signal based on toggle timings (e.g., rising and/or falling edges) of two clock signals from among the first to fourth clock signals CK1 to CK4. The phase difference between the two clock signals may be 180°. Accordingly, the memory interface circuit 210 may obtain a command CMD and/or an address ADDR included in the CA signal. The memory interface circuit 210 may include a CA buffer 211. For example, referring to FIG. 1, the CA signal may be stored in the CA buffer 211 based on the first and third clock signals CK1 and CK3. For example, the CA buffer 211 may be provided with the first and third clock signals CK1 and CK3. A mode in which two of the first to fourth clock signals CK1 to CK4 are in a high impedance (High-Z) state, and the other two of the first to fourth clock signals CK1 to CK4 are in a normal state may be referred to as a 2-phased clock mode. In the 2-phased clock mode, a phase difference between two clock signals in a high impedance (High-Z) state may be 180°. In the 2-phased clock mode, two clock signals in a normal state may toggle between a high level and a low level.

In some embodiments of the inventive concept, the host interface circuit 110 may include first, second, third and fourth controller pads C1, C2, C3 and C4 through which the first to fourth clock signals CK1 to CK4 are transmitted, respectively. The first to fourth controller pads C1 to C4 may be connected to first, second, third and fourth controller termination resistors ODT_C1, ODT_C2, ODT_C3 and ODT_C4, respectively.

In some embodiments of the inventive concept, the host interface circuit 110 may switch the first to fourth clock signals CK1 to CK4 to a high impedance state or a normal state by controlling impedance values of the first to fourth controller termination resistors ODT_C1 to ODT_C4. For example, the host interface circuit 110 may switch the state of the second clock signal CK2 to the high impedance state by changing the impedance value of the second controller termination resistor ODT_C2 to the high impedance state. When the impedance value of the second controller termination resistor ODT_C2 is high impedance, the second clock signal CK2 may not periodically toggle between the high level and the low level. As another example, the host interface circuit 110 may switch the state of the fourth clock signal CK4 to the high impedance state by changing the impedance value of the fourth controller termination resistor ODT_C4 to the high impedance state.

In some embodiments of the inventive concept, the memory interface circuit 210 may switch the first to fourth clock signals CK1 to CK4 to the high impedance state or the normal state by controlling impedance values of first, second, third and fourth memory termination resistors ODT_M1 to ODT_M4. For example, the memory interface circuit 210 may switch the state of the second clock signal CK2 to the high impedance state by changing the impedance value of the second memory termination resistor ODT_M2 to the high impedance state. When the impedance value of the second memory termination resistor ODT_M2 is high impedance, the second clock signal CK2 may not periodically toggle between the high level and the low level. In addition, the memory interface circuit 210 may switch the state of the fourth clock signal CK4 to the high impedance state by changing the impedance value of the fourth memory termination resistor ODT_M4 to the high impedance state.

However, the inventive concept is not limited thereto, and in the 2-phased clock mode, various control signals (e.g., data bus inversion (DBI) and data parity (DPAR)) may be transmitted/received.

The memory interface circuit 210 may sample the DQ signal based on toggle timings (e.g., rising and/or falling edges) of the first to fourth clock signals CK1 to CK4. Accordingly, the memory interface circuit 210 may obtain data DATA included in the DQ signal. The memory interface circuit 210 may include a DQ buffer 212. For example, referring to FIG. 1, the DQ signal may be stored in the DQ buffer 212 based on the first to fourth clock signals CK1 to CK4. A mode in which all of the first to fourth clock signals CK1 to CK4 are in a normal state may be referred to as a 4-phased clock mode. In other words, in the 4-phased clock mode, all of the first to fourth clock signals CK1 to CK4 may toggle between the high level and the low level. The phase difference between any two of the first to fourth clock signals CK1 to CK4 may be 90°.

In some embodiments of the inventive concept, in the 4-phased clock mode, the host interface circuit 110 may transmit all of the first to fourth clock signals CK1 to CK4 to the memory device 200. In other words, in the 4-phased clock mode, all of the first to fourth clock signals CK1 to CK4 may toggle between the high level and the low level. In the 4-phased clock mode, the host interface circuit 110 may transmit a DQ signal to the memory device 200. In some embodiments of the inventive concept, in the 4-phased clock mode, the CA signal may be in a high impedance (Hi-Z) state. In some embodiments of the inventive concept, in the 4-phased clock mode, the host interface circuit 110 may transmit a CA signal to the memory device 200. In other words, in the 4-phased clock mode, the CA signal may be selectively transmitted to the memory device 200. However, the inventive concept is not limited thereto, and in the 4-phased clock mode, various control signals (e.g., DBI and DPAR) may be transmitted/received.

In some embodiments of the inventive concept, frequencies of the first to fourth clock signals CK1 to CK4 may be the same. For example, the frequencies of the first to fourth clock signals CK1 to CK4 may be 1.6 GHz or 3.2 GHz. However, the inventive concept is not limited thereto, and frequencies of the first to fourth clock signals CK1 to CK4 may vary.

The memory interface circuit 210 may generate a control signal iCTRL based on a command CMD and an address ADDR received from the memory controller 100, and may provide the control signal iCTRL to the memory bank 220. For example, the control signal iCTRL may include a row address and a column address.

For example, the memory interface circuit 210 may store data in the CA buffer 211 by sampling the CA signal based on clock signals (e.g., the first and third clock signals CK1 and CK3) having a phase difference of 180°. The memory interface circuit 210 may decode data stored in the CA buffer 211 to a command CMD and an address ADDR. The memory interface circuit 210 may generate the control signal iCTRL based on the decoded command CMD and address ADDR. However, the inventive concept is not limited thereto, and the memory interface circuit 210 may store the data in the CA buffer 211 by sampling the CA signal based on the second and fourth clock signals CK2 and CK4 having a phase difference of 180°.

The host interface circuit 110 may include a fifth controller pad C5 through which the DQ signal is transmitted, and the memory interface circuit 210 may include a fifth memory pad M5 through which the DQ signal is transmitted. The number of pads transmitting the DQ signal is not limited thereto.

The host interface circuit 110 may include a sixth controller pad C6 through which the CA signal is transmitted, and the memory interface circuit 210 may include a sixth memory pad M6 through which the CA signal is transmitted. However, the inventive concept is not limited thereto, and the command signal and the address signal may be transmitted through different pads, respectively.

In some embodiments of the inventive concept, the host interface circuit 110 may include a seventh controller pad C7 through which a read data strobe (RDQS) signal is transmitted, and the memory interface circuit 210 may include a seventh memory pad M7 through which the RDQS signal is transmitted. The memory interface circuit 210 may provide the RDQS signal to the host interface circuit 110, and the host interface circuit 110 may sample the DQ signal based on the RDQS signal. The RDQS signal may be a signal periodically toggling between the high level and the low level.

The memory bank 220 may include a plurality of memory cells connected to word lines and bit lines. For example, each of a plurality of memory cells may be a dynamic random access memory (DRAM) cell. In this case, the host interface circuit 110 and the memory interface circuit 210 may exchange input/output signals based on one of the standards, such as double data rate (DDR), low power double data rate (LPDDR), graphics double data rate (GDDR), a Wide I/O specification, a High Bandwidth Memory (HBM), a Hybrid Memory Cube (HMC), and the like.

The memory bank 220 may write data DATA in memory cells in response to the control signal iCTRL or read data DATA from memory cells in response thereto. The memory bank 220 may further include a row decoder, a column decoder, a sense amplifier, a write driver, and the like for a write operation and a read operation. The memory interface circuit 210 may store data in the DQ buffer 212 by sampling the DQ signal based on the first to fourth clock signals CK1 to CK4. The memory interface circuit 210 may provide data stored in the DQ buffer 212 to a write driver.

The memory controller 100 and the memory device 200 according to an embodiment of the inventive concept may transmit/receive a CA signal and a DQ signal based on multi-phased clock signals.

According to an example embodiment of the inventive concept, the DQ signal may be quickly sampled based on the multi-phased clock signals. Since the memory device 200 may directly receive the multi-phased clock signals from the memory controller 100, components for generating the multi-phased clock signals may be omitted. For example, such components may be omitted from the memory device 200. In addition, since the memory device 200 samples the CA signal based on two clock signals from among the multi-phased clock signals and samples the DQ signal based on the multi-phased clock signals, the timings at which the CA signal and the DQ signal are sampled may be synchronized. Accordingly, the memory device 200 may omit a synchronization operation for synchronizing timings at which the CA signal and the DQ signal are sampled.

Figure 2:
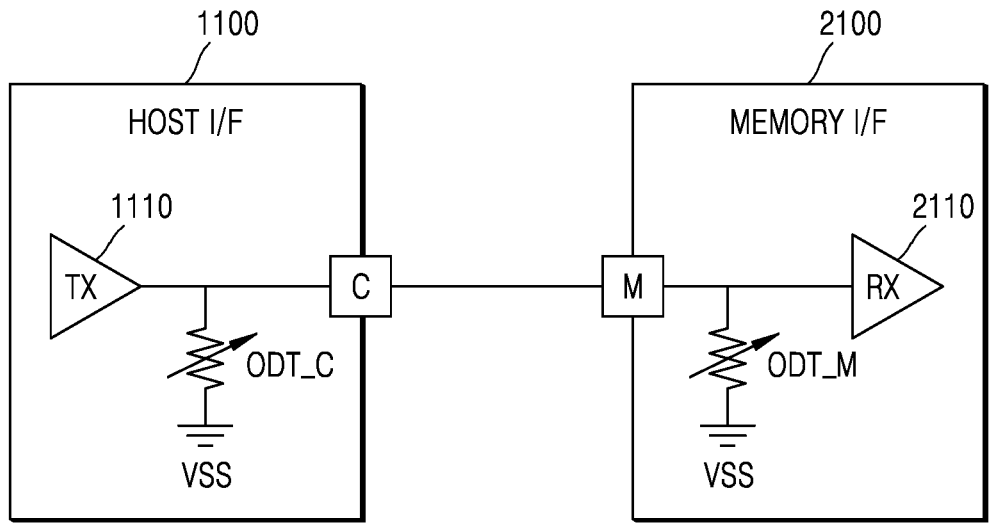
FIG. 2 is a block diagram illustrating a method of controlling a termination resistor, according to an example embodiment of the inventive concept.

FIG. 2 is a block diagram illustrating a method of controlling a termination resistor, according to an example embodiment of the inventive concept.

Referring to FIG. 2, a host interface circuit 1100 may include a controller pad C, and a memory interface circuit 2100 may include a memory pad M. The controller pad C and the memory pad M may be connected to each other. For example, the controller pad C and the memory pad M may be directly connected to each other. The controller pad C may correspond to at least one of the first to seventh controller pads C1 to C7 of FIG. 1, and the memory pad M may correspond to at least one of the first, second, third, fourth, fifth, sixth and seventh memory pads M1, M2, M3, M4, M5, M6 and M7 of FIG. 1.

The host interface circuit 1100 may include a transmitter 1110 and an output of the transmitter 1110 may be connected to the controller pad C. A controller termination resistor ODT_C may be connected between the output of the transmitter 1110 and the controller pad C. The controller termination resistor ODT_C may include a pull-down circuit connected to a VSS voltage, but the inventive concept is not limited thereto. For example, the controller termination resistor ODT_C may be a pull-up circuit connected to a VDD voltage.

In some embodiments of the inventive concept, the host interface circuit 1100 may prevent the output of the transmitter 1110 from toggling by changing the impedance value of the controller termination resistor ODT_C to a high impedance. When the impedance value of the controller termination resistor ODT_C has a high impedance, the output of the transmitter 1110 is in a high impedance state. In some embodiments of the inventive concept, when the impedance value of the controller termination resistor ODT_C has a high impedance, the controller termination resistor ODT_C is disabled. When the impedance value of the controller termination resistor ODT_C has a high impedance, the controller termination resistor ODT_C is turned off.

In some embodiments of the inventive concept, the host interface circuit 1100 may transmit the output of the transmitter 1110 to a receiver 2110 by changing the impedance value of the controller termination resistor ODT_C to a predetermined value. When the impedance value of the controller termination resistor ODT_C has a predetermined value, the output of the transmitter 1110 is in a normal state. In some embodiments of the inventive concept, when the impedance value of the controller termination resistor ODT_C has a predetermined value, the controller termination resistor ODT_C is enabled. When the impedance value of the controller termination resistor ODT_C has a predetermined value, a memory termination resistor ODT_M of the memory interface circuit 2100 is turned on.

The memory interface circuit 2100 may include the receiver 2110, and an input of the receiver 2110 may be connected to the memory pad M. The memory termination resistor ODT_M may be connected between the input of the receiver 2110 and the memory pad M. The memory termination resistor ODT_M may include a pull-down circuit connected to a VSS voltage, but the inventive concept is not limited thereto. For example, the memory termination resistor ODT_M may be a pull-up circuit connected to a VDD voltage.

In some embodiments of the inventive concept, the memory interface circuit 2100 may block the output of the transmitter 1110 from being transmitted to the receiver 2110 by changing the impedance value of the memory termination resistor ODT_M to a high impedance. When the impedance value of the memory termination resistor ODT_M has a high impedance, the output of the transmitter 1110 is in a high impedance state. When the impedance value of the memory termination resistor ODT_M has a high impedance, the memory termination resistor ODT_M is disabled. When the impedance value of the memory termination resistor ODT_M has a high impedance, the memory termination resistor ODT_M is turned off.

In some embodiments of the inventive concept, the memory interface circuit 2100 may transmit the output of the transmitter 1110 to the receiver 2110 by changing the impedance value of the memory termination resistor ODT_M to a predetermined value. When the impedance value of the memory termination resistor ODT_M has a predetermined value, the output of the transmitter 1110 is in a normal state. In some embodiments of the inventive concept, when the impedance value of the memory termination resistor ODT_M has a predetermined value, the memory termination resistor ODT_M is enabled. When the impedance value of the memory termination resistor ODT_M has a predetermined value, the memory termination resistor ODT_M is turned on.

The host interface circuit 1100 may provide, to the memory interface circuit 2100, a command for instructing a change in the impedance value of the memory termination resistor ODT_M. For example, the host interface circuit 110 may provide a command for changing a mode register value to the memory interface circuit 2100 through the sixth controller pad C6 of FIG. 1, and the memory interface circuit 2100 may change an impedance value of the memory termination resistor ODT_M in response to the command.

Figure 3:
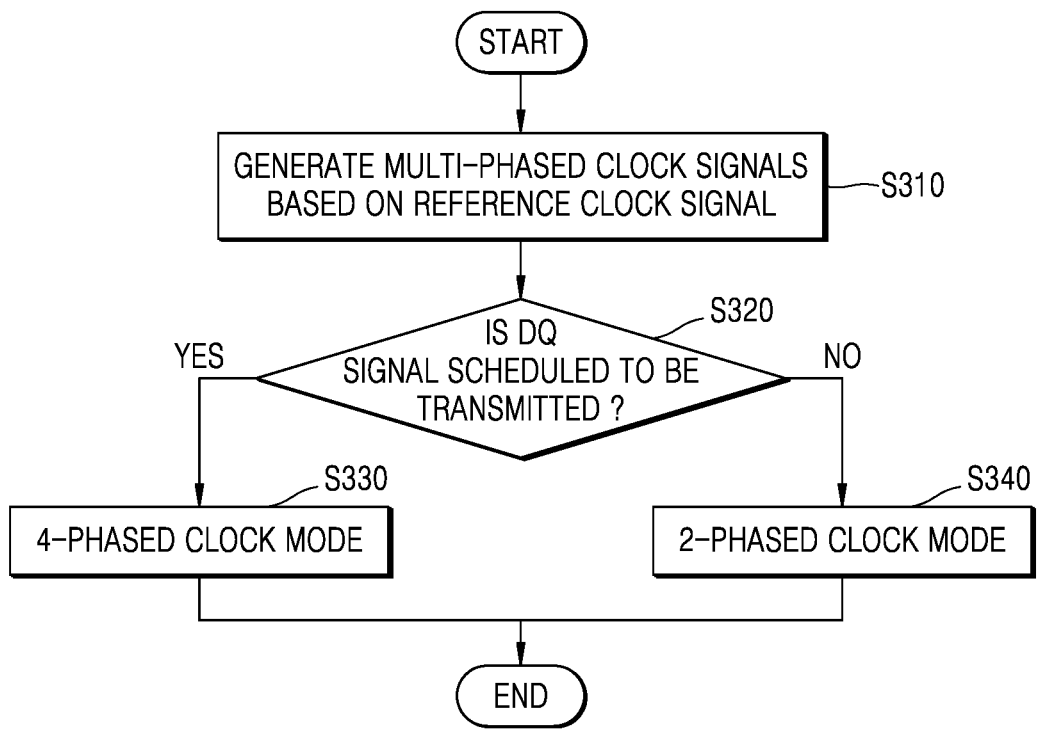
FIG. 3 is a flowchart illustrating a method of operating a memory system, according to an example embodiment of the inventive concept.

FIG. 3 is a flowchart illustrating a method of operating a memory system, according to an example embodiment of the inventive concept. The method of operating a memory system may include a plurality of operations S310, S320, S330 and S340. FIG. 3 may be described later with reference to FIG. 1.

In operation S310, the memory controller 100 may generate multi-phased clock signals based on a reference clock signal. For example, the multi-clock generator 111 included in the memory controller 100 may generate first to fourth clock signals CK1 to CK4. The first to fourth clock signals CK1 to CK4 may have a phase difference of 90° from each other. For example, the phase of the first clock signal CK1 may be 0°, the phase of the second clock signal CK2 may be 90°, the phase of the third clock signal CK3 may be 180°, and the phase of the fourth clock signal CK4 may be 270°. The first to fourth clock signals CK1 to CK4 may have the same frequency.

In operation S320, the memory controller 100 may identify whether a DQ signal is to be transmitted. In some embodiments of the inventive concept, the memory controller 100 may identify whether a DQ signal is transmitted based on whether data is stored in a data register, whether a write command or a read command is provided to the memory device 200, or whether a predetermined time has elapsed after the write command or read command is provided to the memory device 200. When the DQ signal is scheduled to be transmitted, operation S330 may be performed, and when the DQ signal is not scheduled to be transmitted, operation S340 may be performed.

In operation S330, the memory system 10 may operate in a 4-phased clock mode. In the 4-phased clock mode, the first to fourth clock signals CK1 to CK4 may be in a normal state. In other words, the first to fourth clock signals CK1 to CK4 may periodically toggle between the high level and the low level. In some embodiments of the inventive concept, the memory system 10 may operate in a 4-phased clock mode by enabling the memory controller 100 to control the first to fourth controller termination resistors ODT_C1 to ODT_C4 to have predetermined impedance values, respectively. In some embodiments of the inventive concept, the memory system 10 may operate in a 4-phased clock mode by enabling the memory controller 100 to control the first to fourth memory termination resistors ODT_M1 to ODT_M4 to have predetermined impedance values, respectively. Clock signals (e.g., the first clock signal CK1 and the third clock signal CK3) having a phase difference of 180° from among the first to fourth clock signals CK1 to CK4 may be used to sample the CA signal. The first to fourth clock signals CK1 to CK4 may be used to sample the DQ signal.

In operation S340, the memory system 10 may operate in a 2-phased clock mode. In the 2-phased clock mode, two clock signals from among the first to fourth clock signals CK1 to CK4 may be in a normal state, and the other two clock signals may be in a high impedance state. For example, the first and third clock signals CK1 and CK3 may be in a normal state, and the second and fourth clock signals CK2 and CK4 may be in a high impedance state. As another example, the first and third clock signals CK1 and CK3 may be in a high impedance state, and the second and fourth clock signals CK2 and CK4 may be in a normal state. The clock signal in the high impedance state may not periodically toggle between the high level and the low level. In some embodiments of the inventive concept, the memory system 10 may operate in a 2-phased clock mode by enabling the memory controller 100 to control the first and third controller termination resistors ODT_C1 and ODT_C3 to have predetermined impedance values and enabling the memory controller 100 to control the second and fourth controller termination resistors ODT_C2 and ODT_C4 to have high impedance values. In some embodiments of the inventive concept, the memory system 10 may operate in a 2-phased clock mode by enabling the memory controller 100 to control the first and third memory termination resistors ODT_M1 and ODT_M3 to have predetermined impedance values and enabling the memory controller 100 to control the second and fourth memory termination resistors ODT_M2 and ODT_M4 to have high impedance values. Clock signals (e.g., the first clock signal CK1 and the third clock signal CK3) in a normal state may be used to sample the CA signal.

In an operation method of a memory system, according to an example embodiment of the inventive concept, power consumption by a clock signal to be toggled may be reduced by changing a phased clock mode according to whether a DQ signal is transmitted.

Figure 4A:
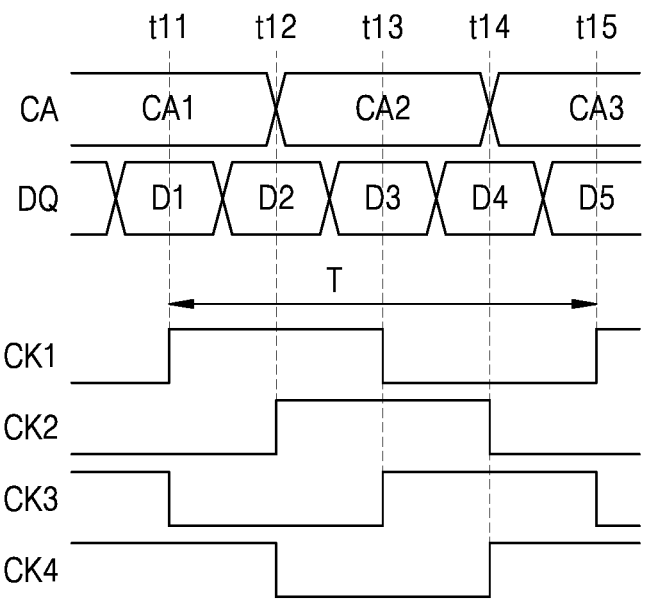
FIGS. 4A and 4B are timing diagrams illustrating a DQ operation and a CA operation according to an example embodiment of the inventive concept.
Figure 4B:
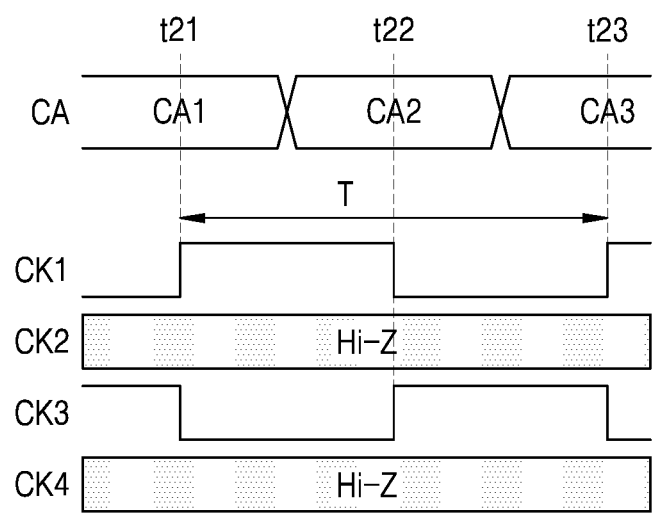

FIGS. 4A and 4B are timing diagrams illustrating a DQ operation and a CA operation according to an example embodiment of the inventive concept. FIGS. 4A and 4B may be described later with reference to FIG. 1.

FIG. 4A may show a timing diagram of a 4-phased clock mode. Referring to FIG. 4A, the first to fourth clock signals CK1 to CK4 may be in a normal state. In other words, the first to fourth clock signals CK1 to CK4 may periodically toggle between a high level and a low level, and each may have a period T. The first to fourth clock signals CK1 to CK4 may have the same frequency.

The DQ buffer 212 may sample the DQ signal based on the first to fourth clock signals CK1 to CK4. For example, the DQ buffer 212 may sample first data D1 based on the first clock signal CK1 at a first time point t11 (e.g., a rising edge of the first clock signal CK1), sample second data D2 based on the second clock signal CK2 at a second time point t12 (e.g., a rising edge of the second clock signal CK2), sample third data D3 based on the third clock signal CK3 at a third time point t13 (e.g., a rising edge of the third clock signal CK3), sample fourth data D4 based on the fourth clock signal CK4 at a fourth time point t14 (e.g., a rising edge of the fourth clock signal CK4), and sample fifth data D5 based on the first clock signal CK1 at a fifth time point t15 (e.g., a falling edge of the first clock signal CK1).

The CA buffer 211 may sample the CA signal based on the first and third clock signals CK1 and CK3. For example, the CA buffer 211 may sample first CA information CA1 based on the first clock signal CK1 at the first time point t11, sample second CA information CA2 based on the third clock signal CK3 at the third time point t13, and sample the third CA information CA3 based on the first clock signal CK1 at the fifth time point t15.

FIG. 4B may show a timing diagram of a 2-phased clock mode. Referring to FIG. 4B, the first and third clock signals CK1 and CK3 may be in a normal state. In other words, the first and third clock signals CK1 and CK3 may periodically toggle between a high level and a low level, and each may have a period T. The first and third clock signals CK1 and CK3 may have the same frequency. The phase difference between the first and third clock signals CK1 and CK3 may be 180°. The second and fourth clock signals CK2 and CK4 may be in a high impedance state. In other words, the second and fourth clock signals CK2 and CK4 may not toggle.

The CA buffer 211 may sample the CA signal based on the first and third clock signals CK1 and CK3. For example, the CA buffer 211 may sample the first CA information CA1 based on the first clock signal CK1 at a first time point t21, sample the second CA information CA2 based on the third clock signal CK3 at a second time point t22, and sample the third CA information CA3 based on the first clock signal CK1 at a third time point t23.

Figure 5:
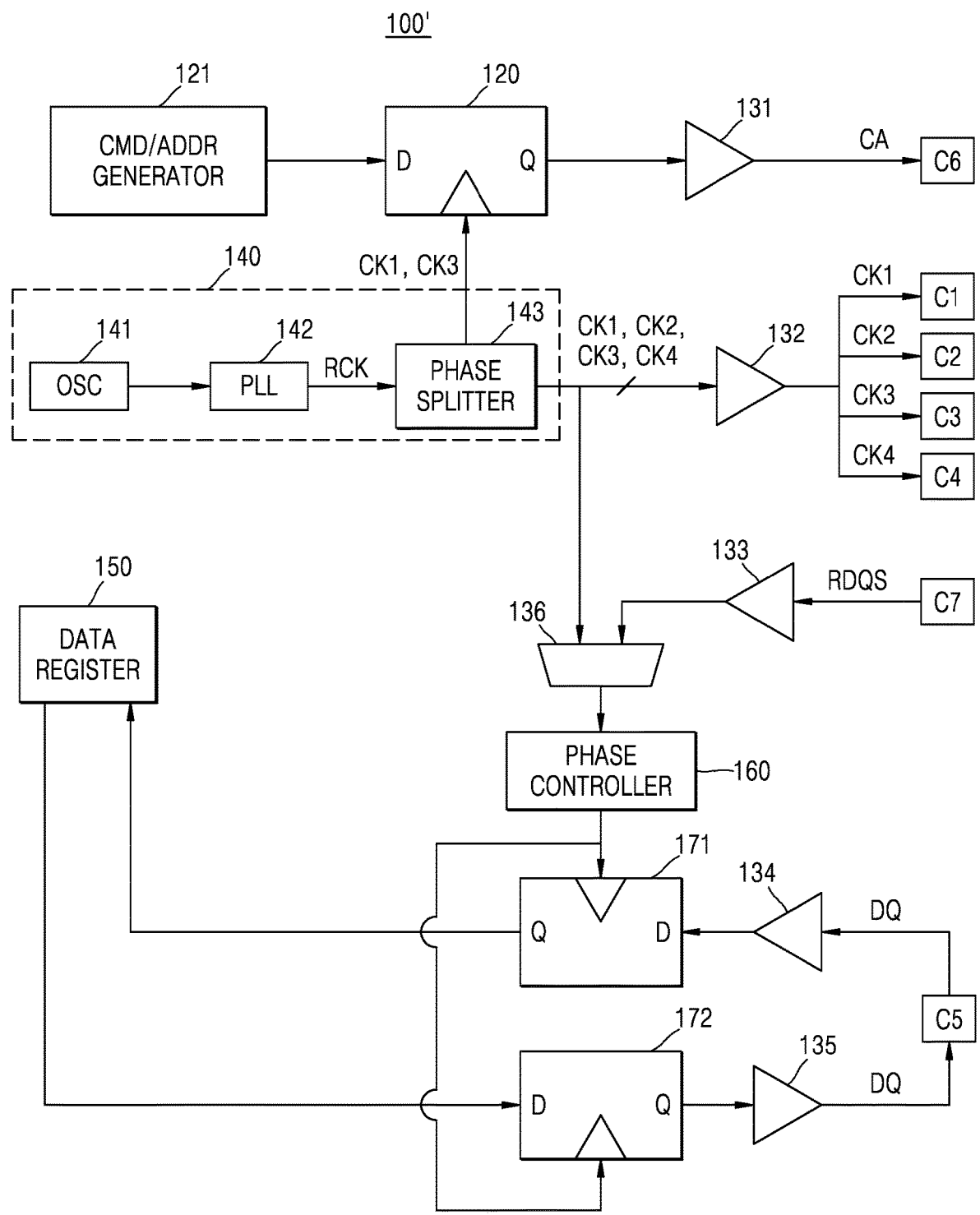
FIG. 5 is a diagram for describing a memory controller according to an example embodiment of the inventive concept.

FIG. 5 is a diagram for describing a memory controller according to an example embodiment of the inventive concept.

Referring to FIG. 5, a memory controller 100' may include a command/address generator 121, a command/address transmission buffer 120, a command/address transmitter 131, a multi-clock generator 140, a clock transmitter 132, an RDQS receiver 133, a multiplexer 136, a data register 150, a phase controller 160, a DQ reception buffer 171, a DQ transmission buffer 172, a DQ receiver 134, and a DQ transmitter 135. FIG. 5 may be described later with reference to FIG. 1.

The command/address generator 121 may generate a command CMD and an address ADDR and provide the same to the command/address transmission buffer 120. The command/address transmission buffer 120 may provide the command CMD and the address ADDR to the command/address transmitter 131 in synchronization with the first and third clock signals CK1 and CK3. The command/address transmitter 131 may provide the command CMD and the address ADDR to the memory device 200 through the sixth controller pad C6.

The multi-clock generator 140 may include an oscillator 141, a PLL circuit 142, and a phase splitter 143. The oscillator 141 may generate an oscillation signal, and the PLL circuit 142 may generate a reference clock signal RCK in response to the oscillation signal. The PLL circuit 142 may provide the reference clock signal RCK to the phase splitter 143. The phase splitter 143 may generate first to fourth clock signals CK1 to CK4 based on the reference clock signal RCK. The phase difference between any two of the first to fourth clock signals CK1 to CK4 may be 90°. The first to fourth clock signals CK1 to CK4 may have the same frequency. The clock transmitter 132 may provide the first to fourth clock signals CK1 to CK4 to the memory device 200 through the first to fourth controller pads C1 to C4. Although one clock transmitter 132 is illustrated in FIG. 5, the inventive concept is not limited thereto, and a separate clock transmitter may be provided for each clock signal.

In some embodiments of the inventive concept, the memory controller 100' may adjust the states of the first to fourth clock signals CK1 to CK4 according to the phased clock mode. For example, the memory controller 100' may adjust the states of the first to fourth clock signals CK1 to CK4 to be in a normal state in the 4-phased clock mode, and may adjust the states of the first to fourth clock signals CK1 to CK4 to be in a high impedance state in the 2-phased clock mode. The first to fourth controller termination resistors ODT_C1 to ODT_C4 may be respectively connected to the first to fourth controller pads C1 to C4 as shown in FIG. 1. In some embodiments of the inventive concept, the memory controller 100' may switch states of the first to fourth clock signals CK1 to CK4 by controlling values of the first to fourth controller termination resistors ODT_C1 to ODT_C4.

According to an example embodiment of the inventive concept, since the first to fourth clock signals CK1 to CK4, which have a phase difference of 90°, may be provided to the memory device 200, the memory device 200 may sample the DQ signal even if the clock signal is not split.

The multiplexer 136 may provide the first to fourth clock signals CK1 to CK4 to the phase controller 160, when the DQ is written, and may provide the read strobe signal RDQS to the phase controller 160, when the DQ is read. The RDQS receiver 133 may receive the read strobe signal RDQS from the memory device 200 through the seventh controller pad C7 and provide the received read strobe signal RDQS to the multiplexer 136.

The phase controller 160 may adjust the phases of the first to fourth clock signals CK1 to CK4 or the phase of the read strobe signal RDQS. The phase controller 160 may provide the first to fourth clock signals CK1 to CK4 to the DQ transmission buffer 172, and may provide the read strobe RDQS signal to the DQ reception buffer 171.

During the DQ read, the DQ reception buffer 171 may sample the DQ signal provided from the DQ receiver 134 in synchronization with the read strobe signal RDQS. The DQ reception buffer 171 may provide the sampled DQ signal to the data register 150. The DQ receiver 134 may obtain the DQ signal via the fifth controller pad C5.

During the DQ write, the DQ transmission buffer 172 may sample data provided from the data register 150 in synchronization with the first to fourth clock signals CK1 to CK4. The DQ transmission buffer 172 may provide the sampled data to the DQ transmitter 135. The DQ transmitter 135 may provide the DQ signal to the fifth controller pad C5.

Figure 6A:
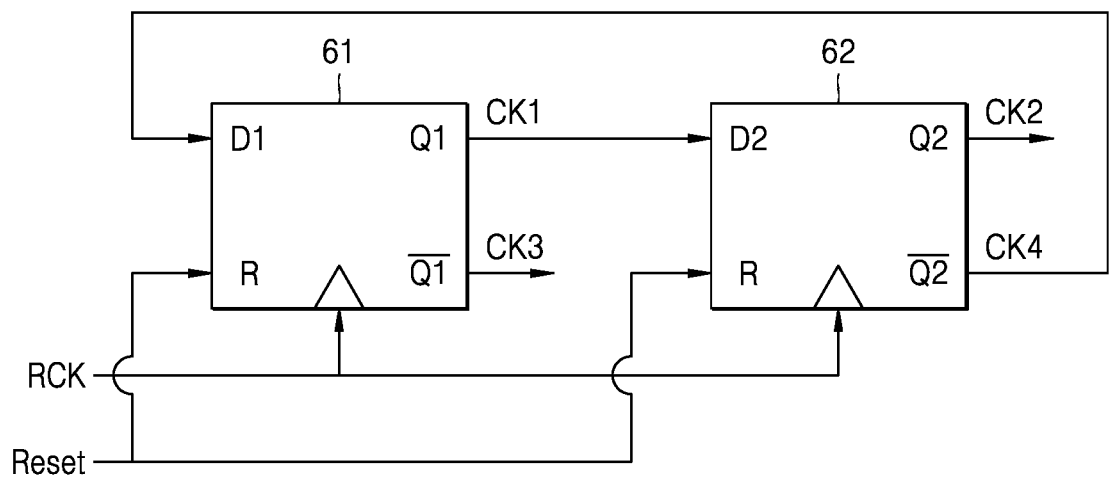
FIGS. 6A and 6B are diagrams illustrating multi-clock generation according to an example embodiment of the inventive concept.
Figure 6B:
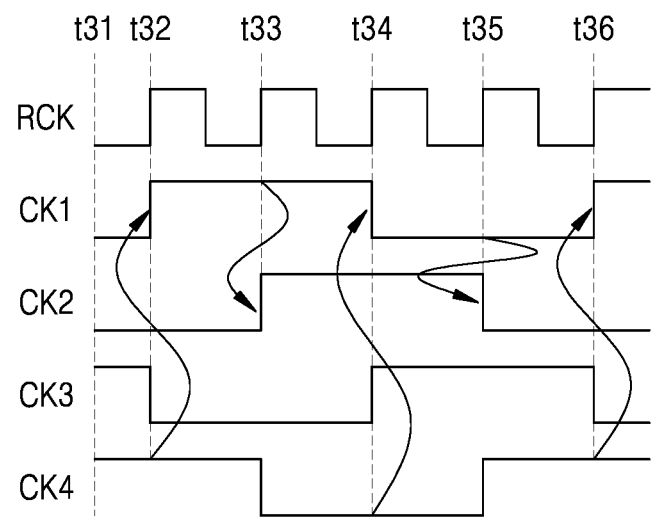

FIGS. 6A and 6B are diagrams illustrating multi-clock generation according to an example embodiment of the inventive concept. For example, FIG. 6A is a circuit diagram illustrating a phase splitter, and FIG. 6B is a timing diagram of a multi-clock signal generated by the phase splitter.

Referring to FIG. 6A, the phase splitter 143 may include a first flip-flop 61 and a second flip-flop 62. However, the structure of the phase splitter 143 according to an example embodiment of the inventive concept is not limited thereto.

The first flip-flop 61 may receive the fourth clock signal CK4 through the input terminal D1, output the first clock signal CK1 through the output terminal Q1, and output the third clock signal CK3 through the output terminal $\overline{Q1}$. The first flip-flop 61 may output the value of the input terminal D1 to the output terminal Q1 in response to the reference clock signal RCK. The value of the output terminal Q1 and the value of the output terminal $\overline{Q1}$ may have an inverted relationship with each other. The first flip-flop 61 may reset the value of the output terminal Q1 to a low level in response to the reset signal, and may reset the value of the output terminal $\overline{Q1}$ to a high level.

The second flip-flop 62 may receive the first clock signal CK1 through the input terminal D2, output the second clock signal CK2 through the output terminal Q2, and output the fourth clock signal CK4 through the output terminal $\overline{Q2}$. The second flip-flop 62 may output the value of the input terminal D2 to the output terminal Q2 in response to the reference clock signal RCK. The value of the output terminal Q2 and the value of the output terminal $\overline{Q2}$ may have an inverted relationship with each other. The second flip-flop 62 may reset the value of the output terminal Q2 to a low level in response to the reset signal, and may reset the value of the output terminal $\overline{Q2}$ to a high level.

Referring to FIG. 6B, the first and second flip-flops 61 and 62 may initially reset the output terminals Q1, Q2, $\overline{Q1}$, and $\overline{Q2}$ in response to a reset signal. In other words, at a first time point t31, the first and second clock signals CK1 and CK2 may be in a low level and the third and fourth clock signals CK3 and CK4 may be in a high level.

At a second time point t32, the first flip-flop 61 may output the value of the input terminal D1 to the output terminal Q1 in response to the reference clock signal RCK. Accordingly, the first clock signal CK1 may transition to a high level at the second time point t32.

At a third time point t33, the second flip-flop 62 may output the value of the input terminal D2 to the output terminal Q2 in response to the reference clock signal RCK. Accordingly, the second clock signal CK2 may transition to a high level at the third time point t33.

At a fourth time point t34, the first flip-flop 61 may output the value of the input terminal D1 to the output terminal Q1 in response to the reference clock signal RCK. Accordingly, the first clock signal CK1 may transition to a low level at the fourth time point t34.

At a fifth time point t35, the second flip-flop 62 may output the value of the input terminal D2 to the output terminal Q2 in response to the reference clock signal RCK. Accordingly, the second clock signal CK2 may transition to a low level at the fifth time point t35.

Timing diagrams of the second to fifth time points t32 to t35 may be repeated from a sixth time point t36.

Figure 7:
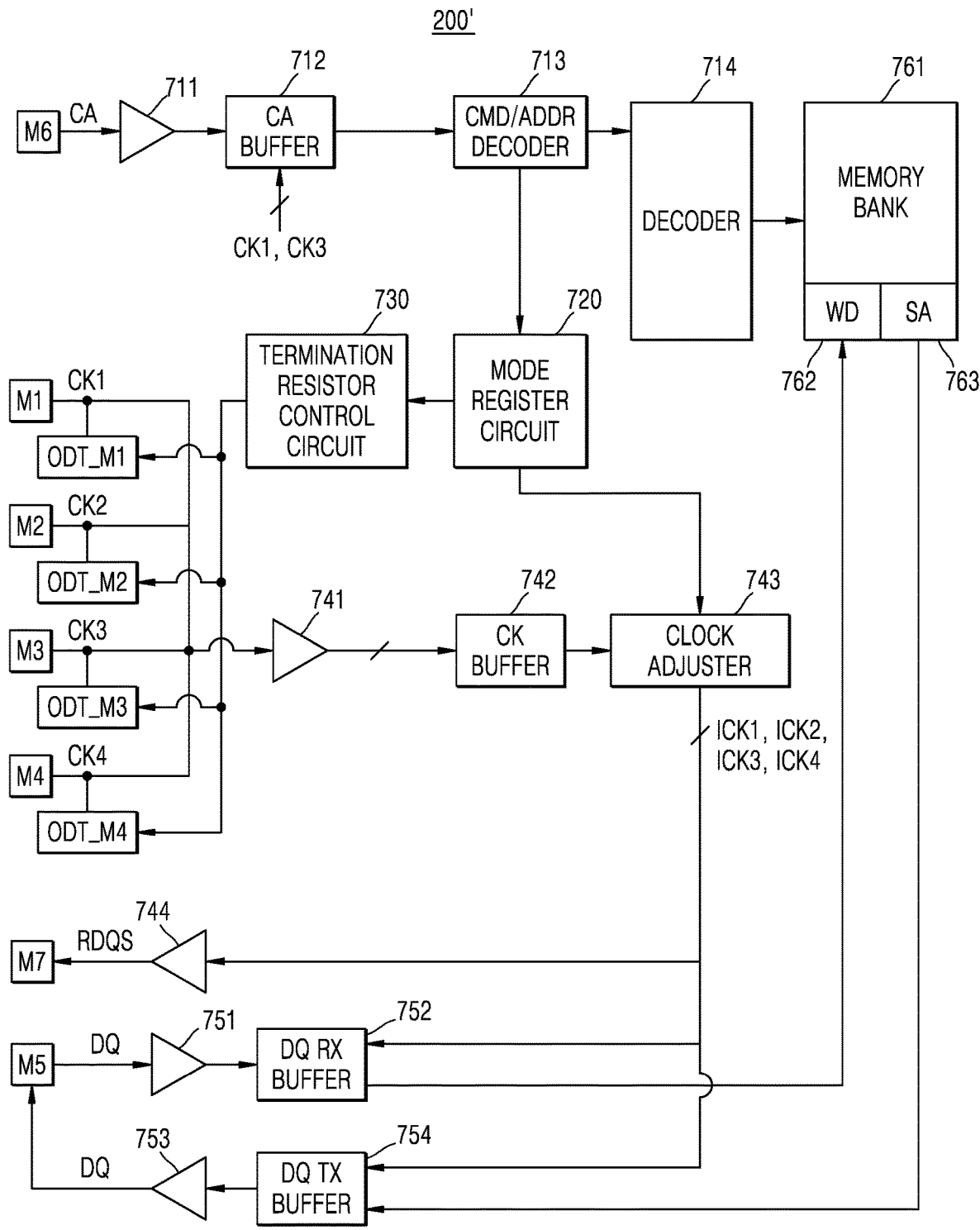
FIG. 7 is a block diagram for describing a memory device according to an example embodiment of the inventive concept.

FIG. 7 is a block diagram for describing a memory device according to an example embodiment of the inventive concept.

Referring to FIG. 7, a memory device 200' may include a CA receiver 711, a CA buffer 712, a command/address decoder 713, a decoder 714, a mode register circuit 720, a termination resistor control circuit 730, a clock receiver circuit 741, a clock buffer 742, a clock adjuster 743, an RDQS transmitter 744, a DQ receiver 751, a DQ reception buffer 752, a DQ transmitter 753, a DQ transmission buffer 754, a memory bank 761, a write driver 762, and a sense amplifier 763. FIG. 7 may be described later with reference to FIG. 1.

The CA receiver 711 may receive the CA signal and provide the CA signal to the CA buffer 712. The CA receiver 711 may receive the CA signal via the sixth memory pad M6. The CA buffer 712 may sample the CA signal based on the first clock signal CK1 and the third clock signal CK3. However, the inventive concept is not limited thereto, and the CA buffer 712 may sample the CA signal based on the second clock signal CK2 and the fourth clock signal CK4 having a phase difference of 180°. The CA buffer 712 may provide sampled CA data to the command/address decoder 713.

The command/address decoder 713 may decode the command CMD or the address ADDR from the CA data. For example, the command/address decoder 713 may decode a read command, a write command, a mode register write command MRW, a mode register read command MRR, a row address, a column address, and the like. The command/address decoder 713 may provide the decoding result to the decoder 714 or the mode register circuit 720.

The decoder 714 may decode the row address and the column address. The decoder 714 may select or activate at least one word line corresponding to the row address. The decoder 714 may select or activate at least one bit line corresponding to the column address.

The mode register circuit 720 may be configured to store various pieces of information required for the operation of the memory device 200'. For example, the mode register circuit 720 may include a plurality of mode registers. Each of the plurality of mode registers may be configured to store predetermined information. For example, the first mode register may be configured to store information on at least one impedance value of the first to fourth memory termination resistors ODT_M1 to ODT_M4.

For example, the second mode register may be configured to store information on duty cycles of the first to fourth clock signals CK1 to CK4. For example, the third mode register may be configured to store skew compensation information of the first to fourth clock signals CK1 to CK4.

The termination resistor control circuit 730 may change impedance values of the first to fourth memory termination resistors ODT_M1 to ODT_M4 based on information stored in the mode register circuit 720 (e.g., information stored in the first mode register). For example, in response to a mode register write command MRW indicating a 2-phased clock mode, the termination resistor control circuit 730 may change impedance values of the second and fourth memory termination resistors ODT_M2 and ODT_M4 to high impedance, and may change impedance values of the first and third memory termination resistors ODT_M1 and ODT_M3 to a predetermined value. The termination resistor control circuit 730 may change impedance values of the first to fourth memory termination resistors ODT_M1 to ODT_M4 to a predetermined value in response to a mode register write command MRW indicating a 4-phased clock mode.

The clock receiver circuit 741 may receive the first to fourth clock signals CK1 to CK4 through the first to fourth memory pads M1 to M4, respectively. A separate receiver may be provided for each of the first to fourth clock signals CK1 to CK4. The clock buffer 742 may sample the first to fourth clock signals CK1 to CK4 based on a separate clock signal.

The clock adjuster 743 may generate the first to fourth internal clock signals ICK1 to ICK4 by adjusting the first to fourth clock signals CK1 to CK4 based on information stored in the mode register circuit 720 (e.g., information stored in the second or third mode register). The clock adjuster 743 may be described in detail with reference to FIG. 8.

The memory bank 761 may include a plurality of memory cells respectively connected to word lines and bit lines. Each of the plurality of memory cells may be configured to store data under the control by the write driver 762, or to output the stored data under the control by the sense amplifier 763.

The RDQS transmitter 744 may provide the first to fourth internal clock signals ICK1 to ICK4 to the memory controller 100 through the seventh memory pad M7.

The DQ receiver 751 may receive a DQ signal from the memory controller 100 through the fifth memory pad M5. The DQ transmitter 753 may transmit the DQ signal to the memory controller 100 through the fifth memory pad M5.

The DQ reception buffer 752 may sample the DQ signal provided form the DQ receiver 751 in response to the first to fourth internal clock signals ICK1 to ICK4. In some embodiments of the inventive concept, the clock adjuster 743 may be omitted, and the DQ reception buffer 752 may sample the DQ signal in response to the first to fourth clock signals CK1 to CK4 received from the clock buffer 742. The DQ reception buffer 752 may provide sampled data to the write driver 762.

The DQ transmission buffer 754 may sample data received from the sense amplifier 763 in response to the first to fourth internal clock signals ICK1 to ICK4. In some embodiments of the inventive concept, the clock adjuster 743 may be omitted, and the DQ transmission buffer 752 may sample data in response to first to fourth clock signals CK1 to CK4 received from the clock buffer 742. The DQ transmission buffer 754 may provide the sampled data to the DQ transmitter 753.

Figure 8:
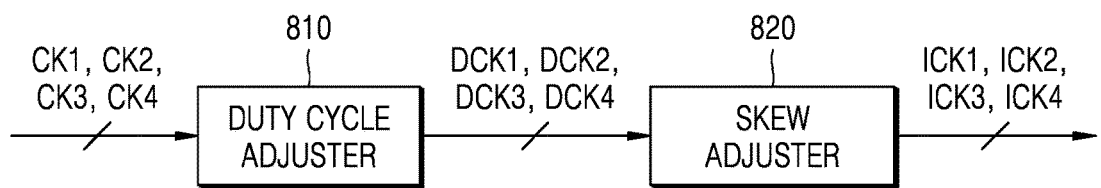
FIG. 8 is a block diagram for describing a clock adjuster according to an example embodiment of the inventive concept.

FIG. 8 is a block diagram for describing a clock adjuster 743 according to an example embodiment of the inventive concept.

Referring to FIG. 8, the clock adjuster 743 may include a duty cycle adjuster 810 and a skew adjuster 820. The clock adjuster 743 may receive the first to fourth clock signals CK1 to CK4 and generate the first to fourth internal clock signals ICK1 to ICK4.

The duty cycle adjuster 810 may adjust the duty cycles of the first to fourth clock signals CK1 to CK4. For example, the duty cycle adjuster 810 may adjust the duty cycles of the first to fourth clock signals CK1 to CK4 to 50%.

The skew adjuster 820 may adjust the skew between the first to fourth clock signals CK1 to CK4 each having an adjusted duty cycle, thereby generating first to fourth internal clock signals ICK1 to ICK4 having a phase difference of 90° from each other.

Figure 9A:
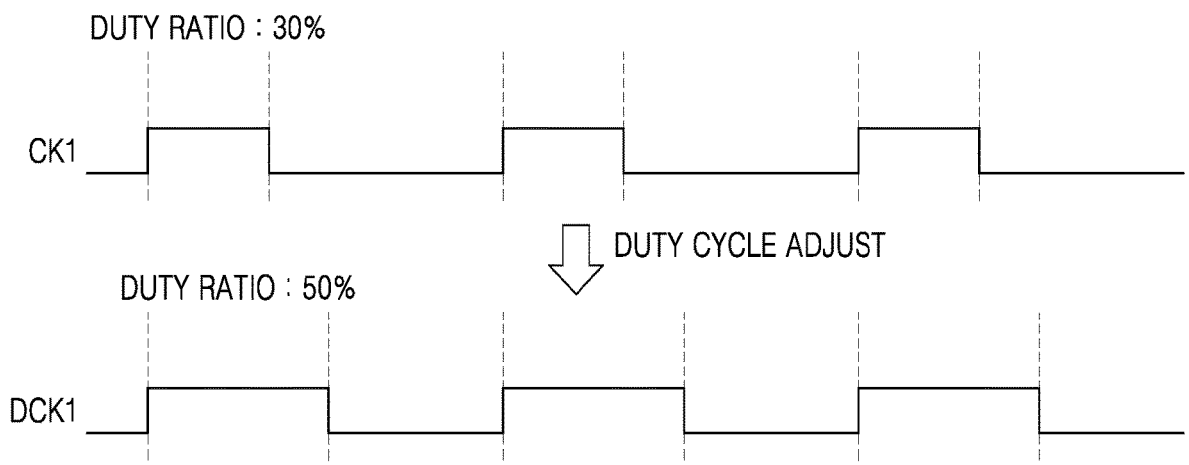
FIGS. 9A and 9B are timing diagrams illustrating a clock adjustment according to an example embodiment of the inventive concept.
Figure 9B:
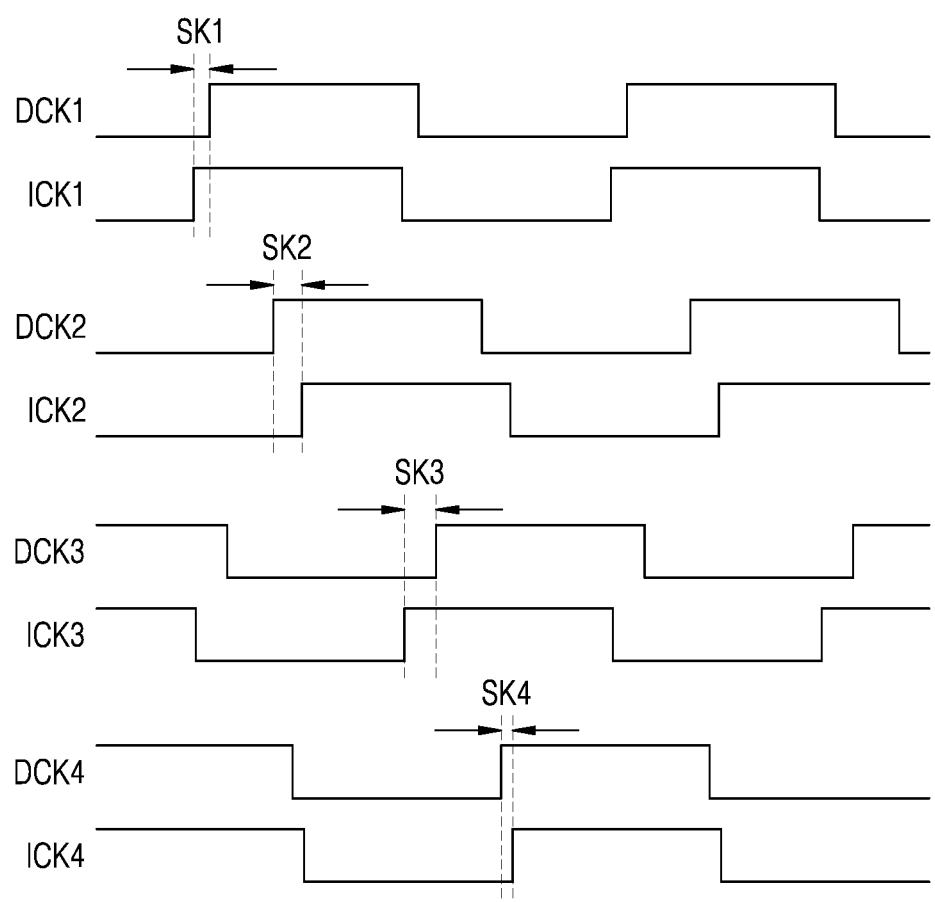

FIGS. 9A and 9B are timing diagrams illustrating a clock adjustment according to an example embodiment of the inventive concept. For example, FIG. 9A is a timing diagram illustrating a duty cycle adjustment, and FIG. 9B is a timing diagram illustrating a skew adjustment. FIGS. 9A and 9B may be described later with reference to FIGS. 7 and 8.

Referring to FIG. 9A, the duty cycle adjuster 810 may generate a first adjusted clock signal DCK1 by adjusting a duty ratio of the first clock signal CK1. A duty ratio of the first clock signal CK1 may be 30%, and a duty ratio of the first adjusted clock signal DCK1 may be 50%. The duty ratio may be a ratio of a time at which a logical high level is maintained within one cycle. The duty ratio of the first clock signal CK1 and the duty ratio of the first adjusted clock signal DCK1 are not limited thereto. Although only the first clock signal CK1 is illustrated, the duty cycle adjuster 810 may generate the second to fourth adjusted clock signals DCK2 to DCK4 by adjusting the duty ratios of the second to fourth clock signals CK2 to CK4. For example, the duty cycle adjuster 810 may generate the second adjusted clock signal DCK2 by adjusting a duty ratio of the second clock signal CK2.

Referring to FIG. 9B, a phase difference between any two of the first to fourth adjusted clock signals DCK1 to DCK4 may be different from 90° due to first to fourth timing skews SK1 to SK4. The skew adjuster 820 may generate the first to fourth internal clock signals ICK1 to ICK4 by compensating for timing skews of the first to fourth adjusted clock signals DCK1 to DCK4. For example, the skew adjuster 820 may identify the first skew SK1 from the first adjusted clock signal DCK1 and compensate for the first skew SK1, to thereby generate the first internal clock signal ICK1. Similarly, the skew adjuster 820 may identify the second skew SK2 from the second adjusted clock signal DCK2 and compensate for the second skew SK2, to thereby generate the second internal clock signal ICK2. The phase difference between any two of the first to fourth internal clock signals ICK1 to ICK4 may be 90° by compensating for the first to fourth skews SK1 through SK4.

Figure 10:
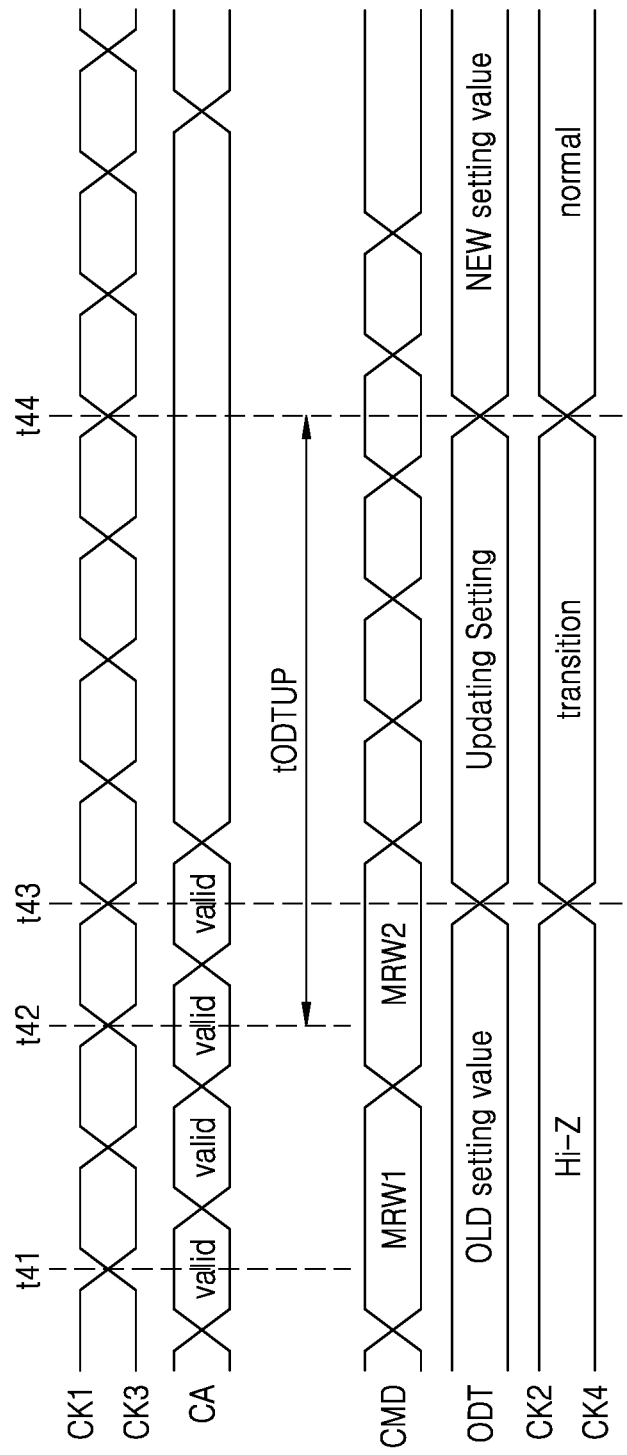
FIG. 10 is a timing diagram for describing a process of changing a termination resistor according to an example embodiment of the inventive concept.

FIG. 10 is a timing diagram for describing a process of changing a termination resistor according to an example embodiment of the inventive concept. FIG. 10 may be described later with reference to FIG. 1 or 7.

Referring to FIG. 10, the termination resistor ODT may have an old setting value at a first time point t41. The termination resistor ODT may correspond to the first to fourth controller termination resistors ODT_C1 to ODT_C4 of FIG. 1, or may correspond to the first to fourth memory termination resistors ODT_M1 to ODT_M4. At the first time point t41, the memory system 10 may operate in a 2-phased clock mode. Therefore, in some embodiments of the inventive concept, the first and third controller termination resistors ODT_C1 and ODT_C3 may have predetermined impedance values so that the first and third clock signals CK1 and CK3 are in a normal state. In some embodiments of the inventive concept, the first and third memory termination resistors ODT_M1 and ODT_M3 may have predetermined impedance values so that the first and third clock signals CK1 and CK3 are in a normal state. Furthermore, in some embodiments of the inventive concept, the second and fourth controller termination resistors ODT_C2 and ODT_C4 may have high impedance values such that the second and fourth clock signals CK2 and CK4 are in a high impedance (Hi-Z) state. In some embodiments of the inventive concept, the second and fourth memory termination resistors ODT_M2 and ODT_M4 may have high impedance values such that the second and fourth clock signals CK2 and CK4 are in a high impedance (Hi-Z) state.

The memory controller 100 may provide the CA signal indicating the first MRW command MRW1 and the second MRW command MRW2 to the memory device 200. An MRW command is a mode register write command and may be a command for changing a setting value of a mode register included in the memory device 200. For example, the MRW command may be a command for changing a setting value of a mode register that stores information on an impedance value of at least one of the first to fourth memory termination resistors ODT_M1 to ODT_M4. In some embodiments of the inventive concept, the MRW command may be a command for changing a setting value of a mode register storing a duty cycle of the first to fourth clock signals CK1 to CK4. In some embodiments of the inventive concept, the MRW command may be a command for changing a setting value of a mode register for storing skew compensation information of the first to fourth clock signals CK1 to CK4.

The CA buffer 211 may sample the first MRW command MRW1 based on the first and third clock signals CK1 and CK3, at the first time point t41, and may sample the second MRW command MRW2 based on the first and third clock signals CK1 and CK3 at the second time point t42.

The setting value of the termination resistor ODT may be updated from the third time point t43 to the fourth time point t44. In other words, the old setting value may be changed. For example, the termination resistor control circuit 730 of the memory device 200' of FIG. 7 may change impedance values of the first to fourth memory termination resistors ODT_M1 to ODT_M4. At the fourth time point t44, the termination resistor ODT may have a new setting value. The fourth time point t44 may be a time point at which the termination resistor update time tODTUP has elapsed from the second time point t42. From the third time point t43 to the fourth time point t44, the states of the second and fourth clock signals CK2 and CK4 may transition from a high impedance state to a normal state. At the fourth time point t44, the second and fourth clock signals CK2 and CK4 may toggle between a high level and a low level. Accordingly, at the fourth time point t44, the memory system 10 may operate in a 4-phased clock mode.

Although it has been described that the memory system 10 is in a 2-phased clock mode at the first time point t41 and the memory system 10 is in a 4-phased clock mode at the fourth time point t44, the inventive concept is not limited thereto. In some embodiments of the inventive concept, the memory system 10 may be in a 4-phased clock mode at the first time point t41, and the memory system 10 may be in a 2-phased clock mode at the fourth time point t44. In other words, the second and fourth clock signals CK2 and CK4 may be in a normal state at the first time point t41, and the second and fourth clock signals CK2 and CK4 may be in a high impedance state at the fourth time point t44.

In some embodiments of the inventive concept, after the fourth time point t44, the clock adjuster 743 may perform the clock adjustment operation for the first to fourth clock signals CK1 to CK4 described above with reference to FIGS. 9A and 9B.

Figure 11:
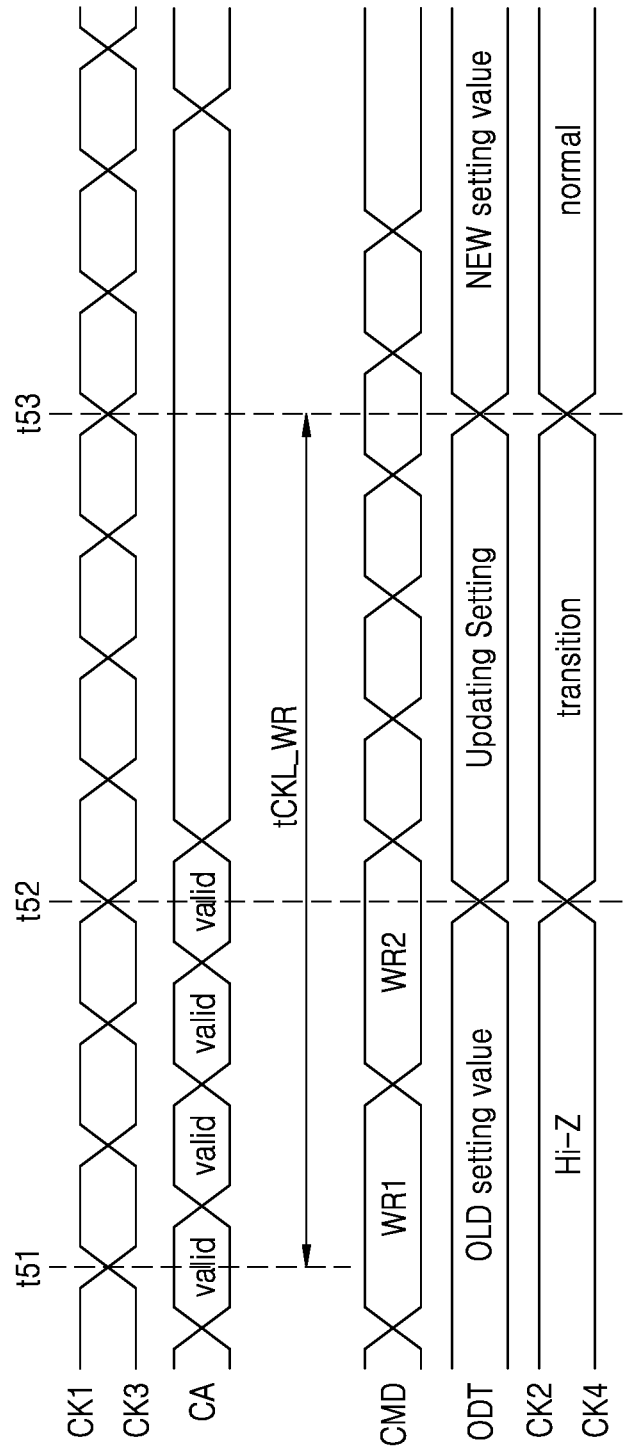
FIG. 11 is a timing diagram of a write command according to an example embodiment of the inventive concept.

FIG. 11 is a timing diagram of a write command according to an example embodiment of the inventive concept. FIG. 11 may be described later with reference to FIG. 1 or 7.

Referring to FIG. 11, at a first time point t51, the CA buffer 712 may sequentially sample a first write command WR1 and a second write command WR2. At the first time point t51, the termination resistors ODT (e.g., the first to fourth memory termination resistors ODT_M1 to ODT_M4) may have an old setting value. The old setting value is described as a high impedance value, but the inventive concept is not limited thereto.

From a second time point t52 to a third time point t53, the setting value of the termination resistor ODT may be updated. For example, the termination resistor control circuit 730 of the memory device 200' of FIG. 7 may change impedance values of the first to fourth memory termination resistors ODT_M1 to ODT_M4. From the third time point t53, the termination resistor ODT may have a new setting value. The third time point t53 may be a time point at which a write clock delay time tCKL_WR has elapsed from the first time point t51. From the second time point t52 to the third time point t53, the states of the second and fourth clock signals CK2 and CK4 may transition from a high impedance state to a normal state. From the third time point t53, the second and fourth clock signals CK2 and CK4 may toggle between a high level and a low level. Accordingly, at the third time point t53, the memory system 10 may operate in a 4-phased clock mode.

In some embodiments of the inventive concept, after the third time point t53, the clock adjuster 743 may perform the clock adjustment operation for the first to fourth clock signals CK1 to CK4 described above with reference to FIGS. 9A and 9B.

While the inventive concept has been particularly shown and described with reference to embodiments thereof, it will be understood that various changes in form and detail may be made thereto without departing from the spirit and scope of the inventive concept as set forth in the following claims.

What is claimed is:

1. A memory device, comprising:
a memory bank including a plurality of memory cells; and
a memory interface circuit configured to store data in the plurality of memory cells based on a command/address signal and a data signal, wherein
the memory interface circuit comprises:
first, second, third and fourth pads configured to receive first, second, third and fourth clock signals, respectively, wherein the first and third clock signals have opposite phases from each other, the second and fourth clock signals have opposite phases from each other, and the first and second clock signals are synchronized;

a first buffer circuit configured to sample the command/address signal in response to an activation time of the first and third clock signals; and a second buffer circuit configured to sample the data signal in response to the activation time of the first clock signal, an activation time of the second clock signal, the activation time of the third clock signal and an activation time of the fourth clock signal.

2. The memory device of claim 1, wherein the first, second, third and fourth clock signals have the same frequency, a phase difference between the first clock signal and the second clock signal is 90°, a phase difference between the first clock signal and the third clock signal is 180°, and a phase difference between the first clock signal and the fourth clock signal is 270°.

3. The memory device of claim 1, wherein the second and fourth clock signals are changed to a high impedance state or a normal state in a first mode.

4. The memory device of claim 3, wherein the memory interface circuit further comprises first, second, third and fourth termination resistors connected to the first, second, third and fourth pads, respectively, wherein the second and fourth termination resistors respectively connected to the second and fourth pads are disabled or enabled in the first mode.

5. The memory device of claim 4, wherein the memory interface circuit enables, during a first reference time, the disabled second and fourth termination resistors in response to a write command.

6. The memory device of claim 4, wherein, when the second and fourth termination resistors are disabled, the second and fourth clock signals are in the high impedance state, and when the second and fourth termination resistors are enabled, the second and fourth clock signals are in the normal state.

7. The memory device of claim 4, wherein the memory interface circuit further comprises:

a first mode register configured to store information about impedance values of the first, second, third and fourth termination resistors; and a termination resistance control circuit configured to change the impedance values of the first, second, third and fourth termination resistors based on the information stored in the first mode register.

8. The memory device of claim 1, wherein the memory interface circuit further comprises:

a second mode register configured to store information about duty cycles of the first, second, third and fourth clock signals; and a clock adjuster configured to adjust the duty cycles of the first, second, third and fourth clock signals based on the information stored in the second mode register.

9. The memory device of claim 8, wherein the memory interface circuit further comprises a third mode register configured to store information about timing skews of the first, second, third and fourth clock signals, and the clock adjuster compensates for the timing skews of the first, second, third and fourth clock signals based on the information stored in the third mode register.

10. The memory device of claim 9, wherein the second buffer circuit comprises:

a data reception buffer configured to sample data received through a fifth pad in response to the activation time of the first, second, third and fourth clock signals; and a data transmission buffer configured to sample data read from the memory bank in response to the activation time of the first, second, third and fourth clock signals.

11. A memory system, comprising:

a memory controller configured to generate first, second, third and fourth clock signals having the same frequency and output the first, second, third and fourth clock signals, a data signal, and a command/address signal, wherein the fi and third clock signals have opposite phases from each other, the second and fourth clock signals have opposite phases from each other, and the first and second clock signals are synchronized; and a memory device configured to sample the command/address signal in response to the first and third clock signals and sample the data signal in response the first, second, third and fourth clock signals.

12. The memory system of claim 11, wherein a phase difference between the first clock signal and the second clock signal is 90°, a phase difference between the first clock signal and the third clock signal is 180°, and a phase difference between the first clock signal and the fourth clock signal is 270°.

13. The memory system of claim 12, wherein the memory controller comprises:

a first flip-flop configured to receive the fourth clock signal at an input terminal and to output the first clock signal and the third clock signal having opposite phases to each other in response to a reference clock signal; and a second flip-flop configured to receive the first clock signal at an input terminal and to output the second clock signal and the fourth clock signal having opposite phases to each other in response to the reference clock signal.

14. The memory system of claim 11, wherein the memory controller operates in a 4-phased clock mode or a 2-phased clock mode based on whether the data signal is to be transmitted to the memory device.

15. The memory system of claim 14, wherein the memory controller further comprises:

first, second, third and fourth controller pads to which the first, second, third and fourth clock signals are transmitted, respectively; and first, second, third and fourth controller termination resistors connected to the first, second, third and fourth controller pads, respectively, and the memory controller enables the first, second, third and fourth controller termination resistors in the 4-phased clock mode and disables the second and fourth controller termination resistors in the 2-phased clock mode.

16. The memory system of claim 11, wherein the memory device further comprises:

first, second, third and fourth memory pads to which the first, second, third and fourth clock signals are transmitted, respectively; and first, second, third and fourth memory termination resistors connected to the first, second, third and fourth memory pads, respectively, and the memory controller enables the first, second, third and fourth memory termination resistors in the 4-phased clock mode and disables the second and fourth memory termination resistors in the 2-phased clock mode.

17. The memory system of claim 11, wherein, the memory device comprises:
- a duty cycle adjuster configured to adjust duty cycles of the first, second, third and fourth clock signals; and
- a skew adjuster configured to compensate for timing skews of the first, second, third and fourth clock signals.

18. A method of operating a memory device, the method comprising:
- receiving first, second, third and fourth clock signals having the same frequency, a data signal, and a command/address signal, wherein the first and third clock signals have opposite phases from each other the second and fourth clock signals have opposite phases from each other, and the first and second clock signals are synchronized;
- sampling the data signal based on the first, second, third and fourth clock signals;
- sampling the command/address signal based on the first and third clock signals; and
- writing the sampled data signal to a memory cell identified by the sampled command/address signal.

19. The method of claim 18, wherein a phase difference between the first clock signal and the second clock signal is 90°,
- a phase difference between the first clock signal and the third clock signal is 180°, and
- a phase difference between the first clock signal and the fourth clock signal is 270°.

20. The method of claim 18, further comprising:
receiving a command; and
adjusting, in response to the command, impedance values of first, second, third and fourth termination resistors respectively connected to first, second, third and fourth memory pads to which the first, second, third and fourth clock signals are transmitted.

21. The method of claim 20, wherein the adjusting of the impedance values of the first, second, third and fourth termination resistors comprises:
- maintaining the first and third termination resistors in an enable state; and
- changing the second and fourth termination resistors from a disable state to an enable state within a reference time from a time point at which the command is received.

* * * * *